(12) United States Patent
Barth, Jr. et al.

(10) Patent No.: US 7,046,565 B1
(45) Date of Patent: May 16, 2006

(54) BI-MODE SENSE AMPLIFIER WITH DUAL UTILIZATION OF THE REFERENCE CELLS AND DUAL PRECHARGE SCHEME FOR IMPROVING DATA RETENTION

(75) Inventors: John E. Barth, Jr., Williston, VT (US); Hoki Kim, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,471

(22) Filed: Feb. 22, 2005

(51) Int. Cl.
*G11C 7/00* (2006.01)
(52) U.S. Cl. ...................................... 365/203; 365/210
(58) Field of Classification Search ................ 365/203, 365/210
See application file for complete search history.

(56) References Cited

U.S. PATENT DOCUMENTS

| | | | |
|---|---|---|---|
| 4,751,681 A * | 6/1988 | Hashimoto | 365/210 |
| 4,816,706 A | 3/1989 | Dhong et al. | |
| 5,526,314 A * | 6/1996 | Kumar | 365/207 |
| 5,880,988 A | 3/1999 | Bertin et al. | |
| 6,097,649 A | 8/2000 | Chiang et al. | |
| 6,151,260 A | 11/2000 | Birk | |
| 6,504,777 B1 | 1/2003 | Hsu et al. | |
| 6,504,789 B1 | 1/2003 | Hirakawa | |
| 6,577,548 B1 | 6/2003 | Barth, Jr. et al. | |
| 2003/0043621 A1 | 3/2003 | Wong | |

\* cited by examiner

*Primary Examiner*—Tuan T. Nguyen
(74) *Attorney, Agent, or Firm*—Graham S. Jones; H. Daniel Schnurmann

(57) ABSTRACT

An electronic memory system includes a memory array of a number of pair of bitlines comprising a true bitline and a complementary bitline. A first normal cell connects to the true bitline (BT0) and a second normal cell connects to the complementary bitline (BC0). A first reference cell connects to the true bitline and a second reference cell connects to the complementary bitline. A clock generates timing pulses including short circuiting-equalization pulses and selectively provides reference potential pulses in a reference potential mode of operation. A sense amplifier has a true terminal connected to the true bitline and a complementary terminal connected to the complementary bitline. An equalization short circuiting circuit connects to the clock and to the true bitline and the complementary bitline for short circuiting the true bitline and the complementary bitline together in response to the short circuiting pulses to equalize the electric potential thereon as a function of short circuiting-equalization. A precharge circuit connects at least one of the true bitline and the complementary bitline to an electrical potential selected from a higher voltage or low voltage reference potential in response to a precharge equalization clock pulse from the clock generator.

20 Claims, 11 Drawing Sheets

BI-MODE SENSE AMPLIFIER WITH DUAL UTILIZATION OF THE REFERENCE CELLS AND DUAL PRECHARGE SCHEME FOR IMPROVING DATA RETENTION

BACKGROUND

In the operation of DRAM (Dynamic Random Access Memory) devices, it is required to maintain data stored in a charge storage cell for a maximum retention period without performing a refresh operation in order to offer high availability and low power consumption. When competing with Static RAM (SRAM) devices, it is also desirable to offer high performance with the same DRAM design. In the current state of the art there are DRAM designs that offer either high retention times for the stored data or high performance. The following art describes a scheme for offering both high retention times for the stored data and high performance with a single circuit configuration. Conventional mid-level sensing schemes precharge the bitlines to mid-level potentials such as VDD/2, VDD/3, or VDD/X (where VDD is power supply voltage and X is a number greater than 1) and offer good retention times for the stored data. Rail sensing schemes precharge the bitlines to VDD or ground (hereinafter referred to as GND) and offer good performance.

When one uses a GND sensing scheme during the precharge time, all the bitlines of the DRAM are precharged to GND. Although a GND precharge sensing scheme can support a wider operating range and provides more overdrive during amplification and more precharge than conventional VDD/2 sensing, it has the problem that it consumes more power. When considering signal development, charge transfer does not begin until the Word-Line voltage is greater than the bitline voltage by the amplitude of a threshold voltage (Vt). This is critical for a longer word-line that will have significant slew rate, e.g. a 1 Volt/nanosecond slew introduces an extra 750 picosecond delay for VDD/2 precharge (equal to about 1.5V). Although GND sense circuits require reference cells (1.5% 16 Megabyte area), they also offer static and dynamic bitline balancing and provide an excellent interlock for sense amplifier timing generation. However, a GND precharge scheme suffers from the problem of degraded retention characteristics for a stored '1', where the drain to source voltage of the storage transistor is the worst case for leakage current through the storage transistor.

Other prior art includes U.S. Pat. No. 4,816,706 of Dhong et al. entitled "Sense Amplifier with Improved Bitline Precharging for Dynamic Random Access Memory", and U.S. Pat. No. 6,577,548 of Barth et al. entitled "Self timing interlock circuit for embedded DRAM."

Sense Amplifiers are described in J. E. Barth et al. "Embedded DRAM design and architecture for the IBM 0.11-m ASIC offering" IBM J. RES. & DEV. VOL. 46 No. 6 pages 675–689 (November 2002).

When one stores a data value of "1" on the storage node of a deep trench capacitor of a memory cell, the drain-source voltage is at level of the supply potential VDD. During the precharge mode, the leakage through the weak channel of the cell transistor is strongly dependent on both the gate-source voltage and the drain-source voltage. Therefore, in a GND sensing scheme, the retention characteristic for a data value of "1" is degraded.

Alternatively, if a VDD sensing scheme is employed for a DRAM, the data value of "0" data retention characteristic of a data value of "0" is degraded by a large degree of leakage. To compensate for such a large degree of leakage, more frequent refresh operations are needed, but frequent performance of a refresh operation has dual disadvantages. The first disadvantage is that data retention functions consume excessive power required to refresh the memory cell. The second disadvantage is that memory availability is degraded because it is inaccessible during the time consumed by performance of the increased number of refresh cycles.

Therefore, both of the above GND and VDD sensing schemes, which present the problem of high cell leakage during the precharge condition, are not suitable for low power applications, even if such schemes show better performance and design robustness regardless of power supply voltage.

Use of mid-level sensing such as VDD/2 or VDD/X (where X is a number greater than 1) provides better cell leakage characteristics. With a mid-level sensing scheme, the data retention characteristic of a data value of "1" is improved because the gate-source voltage of the cell transistor is negative. The degree of data retention of a data value of "0" is also better than that for a VDD sensing scheme because source-drain voltage of the cell transistor is dropped from VDD to (VDD−VDD/2 or VDD/X). Also, the degree of data retention of a data value of "0" is not an issue because another leakage source compen-sates for the cell channel leakage from the bitline to the storage node of the storage capacitor. Although mid-level sensing offers better retention characteristics, performance thereof falls short of objectives.

We have discovered that the best way to solve this problem is to retain the benefits of each of the above-described sensing schemes. Accordingly, the present invention employs hybrid precharge schemes wherein a bitline level is switched from mid-level during a self-refresh, data retention mode of operation to a GND or a VDD sensing scheme during a mission mode of operation. Thus in accordance with this invention a dual precharge scheme is provided. From now on, we designate two operation modes which are the mission mode and the data retention mode. The mission mode is a real data access mode. The data retention mode is just to keep the data without sending or receiving data while running as a low power mode. The bitline precharge level during the mission mode of operation is the same as required for the sensing scheme regardless of precharge or active mode. However, during the self-refresh, data retention mode, the bitline precharge level is maintained around VDD/X, making the gate-source voltage (VDD/X) and reducing the voltage drop across the cell transistor.

This invention provides a new bitline precharge scheme which combines two well known schemes to extend the data retention time during the self-refresh, data retention mode of the memory array and to improve performance during mission mode.

FIG. 1 shows a prior art combination of a clock 24 and a Mid-Level (e.g. VDD/2 or VREFX) sense amplifier system 10 with a related timing diagram shown in FIG. 2 and a clock 24. Sense amplifier system 10, which is implemented with eleven MOSFET devices, includes a true bitline BT0, a complementary bitline BC0, a sense amplifier SA including four FETs, plus seven other FETs, normal cells NC0/NC1, a true bitline capacitor CT, a complementary bitline capacitor CC, and a VREFX-short-circuiting precharge circuit ESR which short circuits true bitline BT0 to complementary bitline BC0 and simultaneously connects both of them to the preocharge potential VREFX, i.e. precharge voltage.

The clock 24 provides three signals to the sense amplifier system 10 including a precharge signal ESP supplied to the VREFX-short-circuiting precharge circuit ESR on a reference potential signal line ERL, a SETN signal on N clock line LN, and a SETP signal on P clock line LP.

Line 11 supplies the system 10 with a precharge potential VREFX, which has a mid-level voltage between the voltage of the power supply voltage VDD and GND (ground).

There are three connections to the true bitline BT0 at nodes 1T, 3T, and 4T. Similarly there are three connections to the complementary bitline BC0 at nodes 1C, 3C, and 4C. The nodes 4T and 4C are connected via true bitline BT0 and the complementary bitline BC0 to the negative and positive terminals respectively of sense amplifier SA and the potentials on nodes 4T and 4C are amplified to VDD or GND by the operation of sense amplifier SA producing an output through those negative and positive terminals as will be well understood by those skilled in the art.

Wordline WLA is connected via node 60 to the gate electrode (hereinafter gate) of NFET N15 of true normal cell NC0. True normal cell NC0 comprises a storage capacitor CS0 and NFET N15. The NFET N15 has its gate connected via node 60 to wordline WLA, its source connected to the true bitline BT0 at node 1T, and its drain connected via a storage node SN0 to the node of true storage capacitor CS0. Complementary normal cell NC1 comprises a complementary storage capacitor CS1 and NFET N14. NFET N14 has its gate connected via node 61 to wordline WLB, its source connected to complementary bitline BC0 at node 1C and its drain connected via a storage node SN1 to the node of the complementary storage capacitor CS1. The opposite terminals of storage capacitors CS0 and CS1 connect via node 52 to GND.

True bitline BT0 is also connected via node 1T to a terminal of true bitline capacitor CT connected at its other end to GND. Complementary bitline BC0 is connected through node 1C to one terminal of complementary bitline capacitor CC, that is also connected at its other end via node 52 to GND.

The nodes 4T and 4C are connected via true bitline BT0 and the complementary bitline BC0 to the negative and positive inputs respectively of the sense amplifier SA and the potentials on node 4T or node 4C are alternatively amplified to VDD or GND by the operation of the sense amplifier SA during operation of the system 10. That is to say that when node 4T is amplified to VDD, node 4C is amplified to GND and that when node 4T is amplified to GND, node 4C is amplified to VDD.

The VREFX-short-circuiting precharge circuit ESR includes NFETs N2, N4, and N3. All three equalization NFETs N2, N3, and N4 of the VREFX short-circuiting precharge circuit ESR have their gates connected via node 51 to be turned ON when they receive the precharge signal ESP on the reference potential precharge line ERL.

The drain of the centrally located short-circuiting NFET N3 is connected via node 3T to the true bitline BT0 and its source connected to the complementary bitline BC0 so that NFET N3 conducts, it short circuits the true bitline BT0 to the complementary bitline BC0.

NFET N2 has its drain connected to the true bitline BT0 via node 3T, and its source connected to the reference precharge source VREFX via node 58 and line 11. NFET N4 has its source connected to the complementary bitline BC0 via node 3C and its drain connected to the voltage source VREFX via node 58 and line 11.

When NFETs N2 and N4 are ON when precharge signal ESP turns ON, they connect true bitline BT0 and the complementary bitline BC0 to the reference precharge source VREFX via node 58 and line 11. At the same time, the NFET N3 short circuits the lines BT0 and BC0 together. The result is that the potentials on true bitline BT0 and complementary bitline BC0 equalize rapidly.

In operation, the reference potential equalization line ERL is connected to clock 24 to receive the short circuiting (reference potential) precharge signal ESP which is shown in the signal timing diagram of FIG. 2. During an equalization phase of operation of the system 10 from time t1 to time ta in each cycle the reference potential precharge signal ESP from clock 24 is applied on the reference potential equalization line ERL to circuit ESR to raise the gate of NFET N3 turning it ON to provide a short circuit connection between the true bitline BT0 and the complementary bitline BC0. At the same time precharge signal ESP is applied to the gates of NFETS N2/N4 which turns them ON so that they interconnect the true bitline BT0 to the complementary bitline BC0 to charge or discharge both of them to the potential of the reference voltage source VREFX via node 58 and line 11.

Preferably the sense amplifier SA shown in FIG. 1 is a conventional cross-coupled circuit made of two inverters. The input and output are cross connected simultaneously, i.e. the output of one inverter is connected to the input of the other inverter and vice versa. When sense amplifier SA is turned on, the nodes 4T and 4C which are tied to the terminals of the sense amplifier SA are alternatively amplified to VDD or GND. The true bitline BT0 and complementary bitline BC0 are two of the inputs of the inverter. The inputs and outputs of the inverter are cross connected simultaneously, i.e. the output of one inverter is connected to the input of the other inverter and vice versa. When the sense amplifier SA is turned on, one of the nodes 4T and 4C tied to the sense amplifier SA is amplified to potential VDD with the other one of the nodes 4T and 4C being at the opposite potential, i.e. GND, as will be well understood by those skilled in the art.

The particular sense amplifier SA shown in FIG. 1 is a cross coupled sense amplifier SA which includes PFET P0 and PFET P1 and two NFETs N0/N1. The gates of FETs P0 and N0 connect to node 4C. The drains of FETs P0 and N0 connect to node 4T. The gates of FETs P1 and N1 connect to node 4T. The drains of FETs P1 and N1 connect to node 4C. The sources of PFETs P0/P1 connect via node 54 to the source of PFET P2, with its drain is connected to potential VDD, and its gate connected to receive the SETN input signal on line LN from clock 24. The sources of NFETs N0/N1 connect via node 55 to the drain of the NFET N5, with its source connected to ground potential, and its gate connected to receive the SETP input signal on line LP from clock 24.

Referring to FIG. 1 and FIG. 2, the SETN signal on clock line LN from clock 24 connects to the gate of PFET P2 which turns ON gate potential VDD to line SNL, which line SNL connects to node 54. The result is that the SETN signal on line LN activates the gate of NFET P2 which gates voltage VDD to node 54 via the input line SNL to the sense amplifier SA. In turn node 54 is adapted to connect voltage VDD to the sources of PFETS P0 and P1 of sense amplifier 54 when the SETN signal turns on PFET P2. Thus, the PFET P2 is adapted to connect voltage VDD to node 54 of sense amplifier SA when PFET P2 receives the on SETN signal on line LN from the clock 24.

The SETP signal on line LP from clock 24 connects to the gate of NFET N5 which gates voltage GND to node 55 via the source drain circuit of NFET N5 and the line SPL. In turn node 55 is adapted to connect GND potential to the sources of NFETS N0 and N1 of sense amplifier SA 54, when the SETP signal on line LP turns on NFET N5. Thus, NFET N5 is adapted to connect GND potential to node 55 of the sense amplifier SA when NFET N5 receives the SETP signal on line LP from the clock 24.

The drains of FETs P0 and N0 are connected via node 4T to the bitline BT0 as are the gates of FETs P1 and N1. The drains of FETs P1 and N1 are connected via node 4C to complementary bitline BC0 as are the gates of FETs P0 and N0. The sources of PFETs P0/P1 are connected via node 54 to the source of the PFET P2, the drain of which is connected to potential VDD, and the gate of which is connected to line LN to receive the SETN input signal. The sources of NFETs N0/N1 are connected via node 55 to the drain of the NFET N5, the source of which is connected to GND, and the gate of which is connected to line LP to receive the SETP input signal.

Operation of the Mid-Level Sense Amplifier System

Referring again to the equalization circuit ESR in FIG. 1, the source/drain circuit of the NFET N2 is connected via node 3T between the true bitline BT0 and VREFX (via node 58 and line 11.) The source/drain circuit of NFET N4 is connected between the complementary bitline BC0 via node 3C and VREFX (via node 58 and line 11).

When it is ON, the source/drain circuit of NFET N3 short circuits the true bitline BT0 (via node 3T) to the complementary bitline BC0 (via node 3C.)

In summary, (referring again to FIG. 1 and FIG. 2) when precharge signal ESP is ON from time t0 to tb, from tk to tB and from tK to tb as the cycle repeats, NFETs N2/N3/N4 conduct short circuiting nodes 3T and 3C together and connecting them to the precharge voltage VREFX through line 11, node 58 and NFETs N2 and N4 thereby equalizing the charge on true bitline BT0 and complementary bitline BC0 at the precharge voltage VREFX.

The VDD/2 sense amplifier circuit 10 of FIG. 1 is an example of an embodiment in which a conventional DRAM sensing scheme is employed known as a "mid-level VDD/X sensing scheme", in which both a true bitline BT0 and complementary bitline BC0 are precharged to a value VREFX, e.g. approximately halfway (VDD/2) between a logic "1" voltage VDD and a logic "0" voltage GND, during a precharge interval by connection through line 11, node 58 and NFETs N2 and N4.

At time tb in FIG. 2 the true normal cell NC0 turns ON when a positive pulse RWA (which lasts until time tk) passes from wordline WLA via node 60 to the gate of NFET N15 thereby coupling the true normal cell capacitor CS0 to the precharged true bitline BT0 via the source/drain circuit of NFET N15 and node 1T. Then, the result is that the voltage on true bitline BT0 increases or decreases slightly, depending on the value of the bit previously stored in the true normal cell capacitor CS0 of the true normal cell NC0, thus creating a differential with respect to the complementary bitline BC0 which still remains at VREFX because the complementary normal cell NC1 is OFF because signal RWB on line WLB in FIG. 2 is low continuously until time tB.

Alternatively, at time tB the complementary normal cell NC1 turns ON when a pulse RWB' (which lasts until time tK) passes from wordline WLB via node 61 to the gate of NFET N14, coupling capacitor CS1 to the precharged complementary bitline BT1 via the source/drain circuit of NFET N14 and node 1C. Then, as a result the voltage on complementary bitline BC0 increases or decreases slightly, depending on the value of the bit stored in the capacitor CS1 of complementary normal cell NC1, thus creating a differential with respect to the true bitline BC0 which still remains at VREFX because the true normal cell NC0 is OFF, as signal RWA is continuously OFF in FIG. 2 from time tk to time tL.

Referring again to FIG. 2, line LN from the clock 24, provides the SETN signal to gate of PFET P2 (that is normally positive except from time tf to tj and from time tF to tJ in FIG. 2.) When PFET P2 is ON it connects potential VDD to line SNL to node 54 of the sense amplifier SA. Line LP from the clock 24 provides the SETP signal to the gate of NFET N5 (which is normally negative except from time tf to tj and from time tF to tJ in FIG. 2.)

The sources of NFET N0 and NFET N1 are connected to node 55, which connects via Set P Line SPL to the drain of the NFET N5, the source of which connects to GND. The gate of the NFET N5 is connected to receive the SETP pulse to turn ON during the time intervals from time tf to tj and from time tF to tJ in FIG. 2 in response to the SETP signal, thereby lowering node 55 to GND via source/drain circuit of the NFET N5 during that interval.

The result is that the sense amplifier SA is energized during the time intervals from tf to tj and from time tF to tJ when the node 54 connects to VDD and node 55 connects to GND when the SETN pulse on the sense amplifier signal line SETN is down, so the PFET P2 conducts, and the SETP pulse on the sense amplifier enable line SETP is positive, so the NFET N5 conducts, connecting GND potential to node 55.

True Bitline Cycle and Complementary Bitline Cycle

Equalization and Precharge Cycles

In FIG. 2, the system 10 goes through normal access and precharge cycles. From time t0 to time tk, the system 10 also goes through the normal access for NC0 and precharge cycle. Then from time tk to tL, the system 10 also goes through the normal access for NC1 and precharge cycle.

FIG. 3 shows a prior art combination of a clock 34 and a GND sense system 20 that operates as indicated by the signal timing diagram shown in FIG. 4. The system 20 is a modification of the mid-level (VDD/X) sense amplifier circuit 10 of FIG. 1, which is modified to include a reference cell RC0, a reference cell RC1 and an equalization circuit ESG, which is connected to ground instead of the precharge potential VREFX. The true normal cell NC0 and the complementary normal cell NC1 are the same as in FIG. 1, as is the sense amplifier SA. The clock is modified since it must produce different timing signals in response to input signal 22.

The reference cell RC0 has inputs connected to line Q0 and word line WL0 from the clock 34. The reference cell RC1 has inputs connected to word line WL1 and line Q1 from the clock 34.

Reference cell RC0 includes NFET N6, NFET N7, and a true bitline reference cell capacitor C0. The input line Q0 from clock 34 connects to the gate of NFET N6. The input line WL0 signal from clock 34 connects to the gate of NFET N7. The drains of NFET N6 and NFET N7 connect via node 56 to the node of capacitor C0, the other terminal of which connects to GND. The source of NFET N7 connects via node 2T to the true bitline BT0. The source of NFET N6 connects via line 11 and node 59 to the reference potential input VREFX.

Reference cell RC1 includes NFET N8, NFET N9, and a complementary bitline reference cell capacitor C1. The input line Q1 from clock 34 connects to the gate of NFET N9. The drains of NFET N8 and NFET N9 connect via node 57 to the node of capacitor C1, the other terminal of that connects to GND. The source of NFET N8 connects via node 2C to complementary bitline BT0. The source of NFET N9 connects via line 11 and node 59 to the reference potential input VREFX Access of NC1 and Precharge The voltage on capacitor C0 in the reference cell RC0 is charged when signal REQ0 on line Q0 is high from time t0 to tc and from time th to tL remaining on until time tc on the next cycle. When line Q0 is high, it turns NFET N6 ON which connects the voltage on VREFX via line 111 and node 59, the source drain circuit of NFET N6 and node 56 to node of capacitor C0. The charge on capacitor C0 in reference cell RC0 is transferred to the true bitline when the signal RWL0 on line WL0 is high from time tb to time th, thereby turning ON NFET N7 to provide a reference potential from capacitor C0 via node 56, the source drain circuit of NFET N7 and node 2T.

The RWL0 signal on line WL0 turns ON at time tb and OFF at time th instead of remaining on.

From time t0 to time tB the RWL1 signal on line WL1 remains OFF so the charge on capacitor C1 is not connected to the complementary bit line, and there is no interaction through RC1 with bitline.

Access of NC2 and Precharge

The voltage on capacitor C1 in the reference cell RC1 is charged from time t0 to time tB when signal REQ1 on line Q1 is high, thereby turning on NFET N9 that connects the voltage on VREFX via line 11, node 59, the source drain circuit of NFET N9, and node 57 to the node of capacitor C1. The charge on capacitor C1 in the reference cell RC1 is transferred to the true bitline when the signal RWL1 on line WL1 is high from time tB to time tH, thereby turning ON NFET N8 to provide a precharge of the reference potential from capacitor C1 via the source drain circuit of NFET N8 and node 2C The RWL1 signal on line WL1 turns ON at time tB and OFF at time tH instead of remaining on.

From time tk to time tL the RWL0 signal on line WL0 remains OFF so the charge on capacitor C0 is not connected to the true bit line BT0, and there is no interaction through RC0 with bitline.

Referring to FIGS. 3 and 4, with respect to the reference cell RC0, the mid-level potential source VREFX is cyclically connected to charge the capacitor C1 via NFET N6 because line Q0 receives a variable REQ0 potential which turns the gate of NFET 6 OFF at time tc and ON at time th cyclically. Next, the node 56 is cyclically connected to node 2T via NFET N7 because line WL0 receives a variable RWL0 potential which turns the gate of NFET 8 OFF at time tc and turns it ON at time th cyclically in synchronism with REQ0.

At times indicated in FIG. 4, the mid-level potential source VREFX is connected to charge the capacitor C1 via line 11, node 59, and NFET N9 when the signal REQ1 supplied on line Q1 to the gate of the NFET 9 is ON which turns ON the NFET 9 except from time tB to tH. Next, the node 57 is connected to node 2C via NFET N8 because signal RWL1 on line WL1 to the gate of NFET 7 is ON from time tB to tH cyclically in synchronism with signal REQ1.

Clock 34 provides a short circuiting-precharge signal ESP to the equalization circuit ESG via line EQL and node 51. The equalization circuit ESG includes the NFET N3 which short circuits true bitline BT0 and complementary bitline BC0 together as in FIG. 1, but circuit ESG connects through the source drain circuits of NFETs N2 and N4 and node 52 to GND instead of VREFX.

Clock 34 also provides the SETN signal on clock line LN, and a SETP signal on clock line LP differently from clock 24 in FIG. 1 in that the SETP signal on line LP is always connected to GND in the system 20, since the NFET N5 has been omitted from the circuit. The SETP input line LP' is shown for purposes of explanation since it is redundant in view of the direct connection of node 55 to GND.

Equalization of Charge on Bitlines

When the precharge signal ESP on line EQL is ON from time t0 to ta, the NFETs N2/N3/N4 are ON and conduct bringing nodes 3T and 3C together, connecting nodes 3T and 3C to ground via node 52 and NFETs N2 and N4 thereby equalizing charge on true bitline BT0 and complementary bitline BC0 at the reference voltage VREFX. As with the embodiment of FIG. 1, NFET N3 short circuits lines BT0 and BC0 together when NFET N3 is conducting. Thus the short circuiting precharge signal ESP on line EQL both short circuits and grounds true bitline BT0 and complementary bitline BC0 during the time interval tl to ta.

The GND sense amplifier system 20 includes sense amplifier SA plus ten additional MOSFETs but there are significant differences. First the NFET N5 has been eliminated. Second, when the equalization circuit ESG is turned ON by the precharge signal ESP on lie EQL, the circuit ESG connects the true bitline BT0 and the complementary bitline BC0 to ground (GND) instead of a mid-level potential (VDD/X). The sense amplifier SA shown in FIG. 2 can be identical to the sense amplifier SA shown in FIG. 1 or can be modified to include another equivalent sense amplifier circuit as will be well understood by those skilled in the art.

In the case of the sense amplifier circuit 20 of FIG. 2, the SETP input, and NFET N5 are omitted from the sense amplifier system 20. Instead the SPL input line to the sense amplifier SA is permanently connected to ground GND. Moreover, both the source of the equalization NFET N2 and the drain of the equalization NFET N4 are now connected to GND via the node 52, i.e. not to the mid-level potential source VREFX, unlike circuit 20 of FIG. 1.

As in FIG. 1, the drain of equalization NFET N3 remains connected via node 3T to the drain of equalization NFET N2 and to true bitline BT0. Similarly, the sources of equalization NFET N4 NFET N3 remain connected via node 3C to the complementary bitline BC0.

In operation, referring to the signal timing diagram of FIG. 4 at the times indicated thereby, the mid-level potential source VREFX is connected to charge the capacitor C2 via NFET N9 when line 19 receives a positive REQ1 pulse turning on the gate of NFET 9. At times when signal REQ0 on line Q0 is high as indicated by FIG. 4, the mid-level potential source VREFX is connected to charge the capacitor C1 via NFET N6 because the positive REQ0 pulse on the gate of NFET 6 turns it ON.

In FIG. 4, from time tl to time ta, the REQ0 signal on line 16 is ON turning ON the NFET N6 gate, thereby charging the reference cell capacitor C1 to the VREFX potential of the reference voltage source on line 11. At time ta the REQ0 signal turns OFF, turning OFF NFET N6 from time ta to ti. An instant later, at time tb, the reference wordlines RWL0 begins to rise and reaches the fully ON state at time tc.

The input line 19 connects the REQ1 signal on line RWL1 (which is ON except from times tB to tK) to the gate of NFET N9 to turn it ON, thereby charging reference cell capacitor C2 to the VREFX potential of the reference voltage source on line 11, in FIG. 4 when the Reference EQualize signal REQ0 is ON.

The word line WL1 connects the first wordline signal RWL1 to the gate of NFET N8 thereby maintaining NFET N7 OFF continuously, so the capacitor C2 does not transfer charge to the complementary bitline BC0.

However, there is a reversal of the REQ0/RWL0 signals with the REQ1/RWL1 so that the REQ1/RWL1 signals rise and fall as shown for the REQ0/RWL0 signals in FIG. 4 after time tB. In particular, RWL0 is OFF continuously and REQ0 is ON continuously from time tl to time TK, so the sense amplifier system 20 operates to charge the complementary bitline BC0 to voltage VREFX from capacitor C1, when the voltage on line WL1 is raised in response to turning ON of the signal RWL1; etc.

In contrast with FIG. 1, from time tl to ta, the grounding precharge signal ESP on equalization-and-grounding line EQL connects via node 51 to the gates of the equalization NFETs N2/N3/N4 to turn those equalization NFETs ON. However, as indicated above, equalization NFETs N2/N3/N4 of a grounding-short-circuiting equalization circuit ESG connect true bitline BT0 and complementary bitline BC0 via nodes 3T and 3C respectively to GND via source drain circuits of the equalization NFETs N2/N3/N4, prior to turning ON the gate of NFET N7 when signal RWL0 on line WL0 begins to rise at time tb.

For performance reasons, the GND sensing scheme of FIGS. 3 and 4 precharges the bitline pair BT0/BC0 to GND before a read operation between time t0 and time ta and in FIG. 4 starting at time tk by turning ON the grounding equalization signal ESP connected via node 51 and equalization-and-grounding line EQL to raise the gates of equalization NFETs N2/N3/N4 to turn those equalization NFETs ON, thus connecting both bitline BT0 and complementary bitline BC0 via nodes 3T and 3C to GND via source drain circuits of the three equalization NFETs N2/N3/N4 of grounding-short-circuiting equalization circuit ESG.

Because of the precharging to GND, lines 17/18 for reference wordlines pulses RWL0/RWL1 are needed to place a reference voltage VREFX e.g., (Vread1−Vread0)/2) on either the true bitline BT0 or the complementary bitline BC0 in order to be able to read a 0 bit. Typically this is accomplished by placing VREFX (approximately VDD/2) in the reference cell via a precharge device, and selecting a reference word line RWL1 on the opposing bitline BC0 coupled to the selected word-line RWL0.

For example, from time t0 to time tb in FIG. 4 the signal REQ0 is ON causing the line Q0 to turn ON the NFET N6 in reference cell RC0 in FIG. 3 connecting reference voltage VREFX to capacitor C0 from terminal VREFX via node 59.

In addition to power savings, use of a VDD/X voltage such as VDD/2 reduces drain-source voltage Vds of the array device in the precharge state; and subsequently a VDD/X voltage such as VDD/2 reduces array device off current. That results in extended retention times and further decreases power consumption. To provide simultaneously a low power retention mode and a high performance active mode, it is desirable to enable the sense amplifier to operate in either a VDD/X precharge or GND precharge mode.

SUMMARY OF THE INVENTION

The invention and objects and features thereof will be more readily apparent from the following detailed description and appended claims when taken with the drawings.

In accordance with this invention, an electronic memory system includes a memory array of a number of pair of bitlines comprising a true bitline and a complementary bitline. A first normal cell connects to the true bitline (BT0) and a second normal cell connects to the complementary bitline (BC0). A first reference cell connects to the true bitline and a second reference cell connects to the complementary bitline. A clock generates timing pulses including short circuiting-equalization pulses and reference potential pulses in a reference potential mode of operation. A sense amplifier has a true terminal connected to the true bitline and a complementary terminal connected to the complementary bitline. An equalization short circuiting circuit connects to the clock and to the true bitline and the complementary bitline for short circuiting the true bitline and the complementary bitline together in response to the short circuiting pulses to equalize the electric potential thereon as a function of short circuiting-equalization. A precharge circuit connects at least one of the true bitline and the complementary bitline to a electrical potential selected from a higher voltage or low voltage reference potential in response to a precharge equalization clock pulse from the clock generator.

Preferably, there are dual precharge levels, one for normal access, mission mode and the other for data retention, self refresh mode; and the precharge levels are changed dynamically from mission mode to data retention, self-refresh mode. Preferably, two sets of transistors are used to supply two different precharge levels. Preferably, one precharge level is supplied by VREFX, power supply voltage for precharging reference cells. Preferably, the other precharge level is supplied by the same power supply for precharging the true bitline and the complementary bitline during mission mode to ground. Preferably, one precharge level is supplied by shunting true bitline and the complementary bitline during precharge cycle without any additional power supply voltage for precharging. Preferably, one precharge level is supplied through the reference cell that is used in mission mode operation to the true bitline and the complementary bitline during a precharge cycle without any additional means to provide a precharge voltage.

In accordance with another aspect of this invention a memory array includes a number of pairs of bitlines with a pair comprising a true bitline and a complementary bitline. A first normal cell connects to the true bitline and a second normal cell connects to the complementary bitline. A first reference cell connects to the true bitline and a second reference cell connects to the complementary bitline. A clock generates timing pulses including short circuiting-equalization pulses and reference potential pulses in a reference potential mode of operation. A sense amplifier having a true terminal connects to the true bitline and a complementary terminal connects to the complementary bitline. Equalization short circuiting means connects to the clock and to the true bitline and the complementary bitline for short circuiting the true bitline and the complementary bitline together in response to the short circuiting pulses to equalize the electric potential thereon as a function of short circuiting-equalization and connecting the bitlines to either ground or a reference voltage. Dual precharge circuit means precharges in a normal access mission mode which is a data access mode operation and precharges in a data retention, self-refresh mode operation.

Further in accordance with this invention, a method is provided for operating an electronic memory system including a memory array which includes a number of pairs of bitlines including a true bitline and a complementary bitline, a first normal cell connected to the true bitline and a second normal cell connected to the complementary bitline, a first reference cell connected to the true bitline and a second reference cell connected to the complementary bitline, a clock for generating timing pulses including short circuiting-equalization pulses and for selectively providing reference potential pulses in a reference potential mode of operation, a sense amplifier having a true terminal connected to the true bitline and a complementary terminal connected to the complementary bitline. Provide equalization short circuiting means connected to the clock and to the true bitline and the complementary bitline for short circuiting the true bitline and the complementary bitline together in response to the short circuiting pulses to equalize the electric potential thereon as a function of short circuiting-equalization; and provide precharge circuit means for connecting at least one of the true bitline and the complementary bitline to a electrical potential selected from a higher voltage or low voltage reference potential in response to a precharge equalization clock pulse from the clock generator.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

FIRST EMBODIMENT

Figure 1:
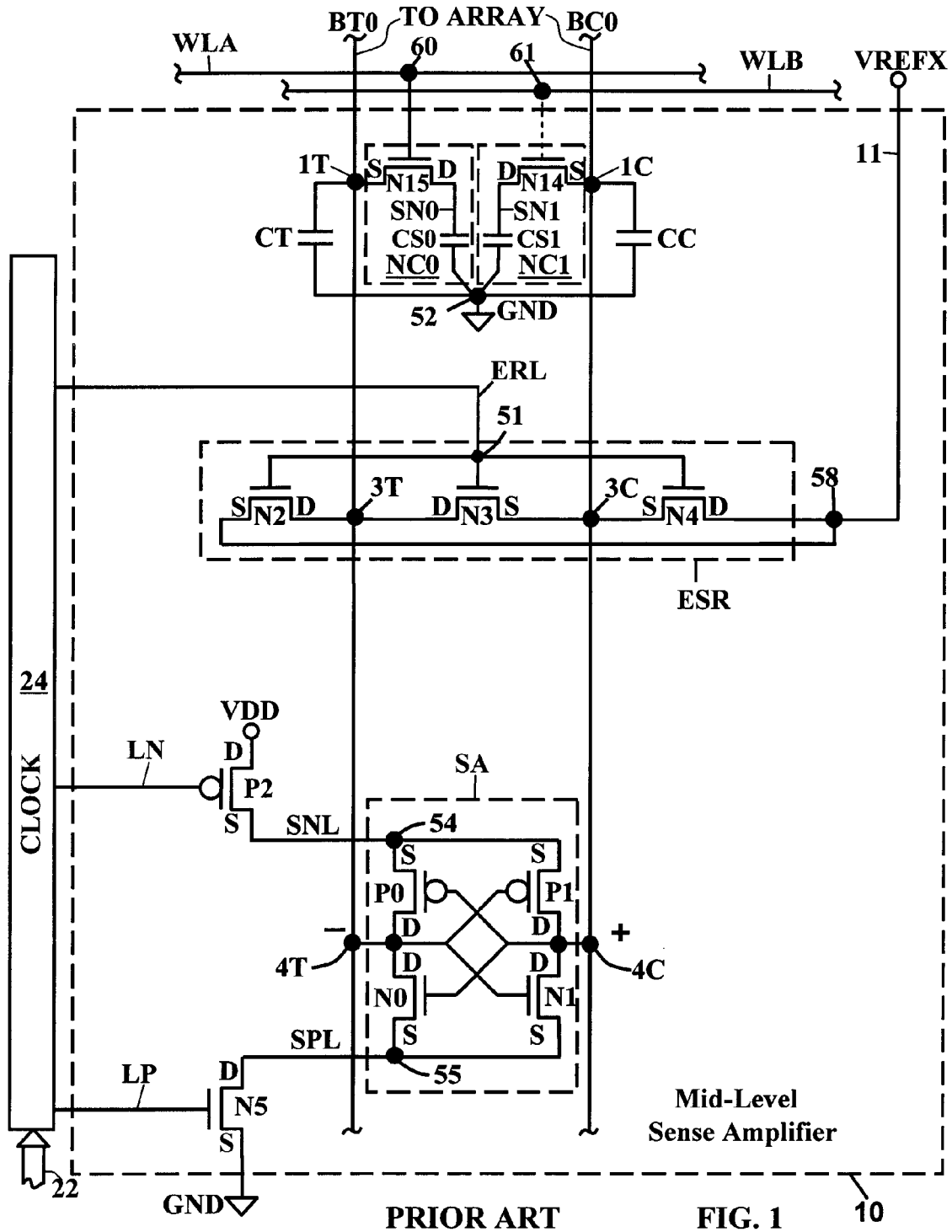
FIG. 1 shows a prior art combination of a clock and a Mid-Level sense amplifier system as indicated by the Self-Refresh, data retention mode timing diagram shown in FIG. 2
Figure 3:
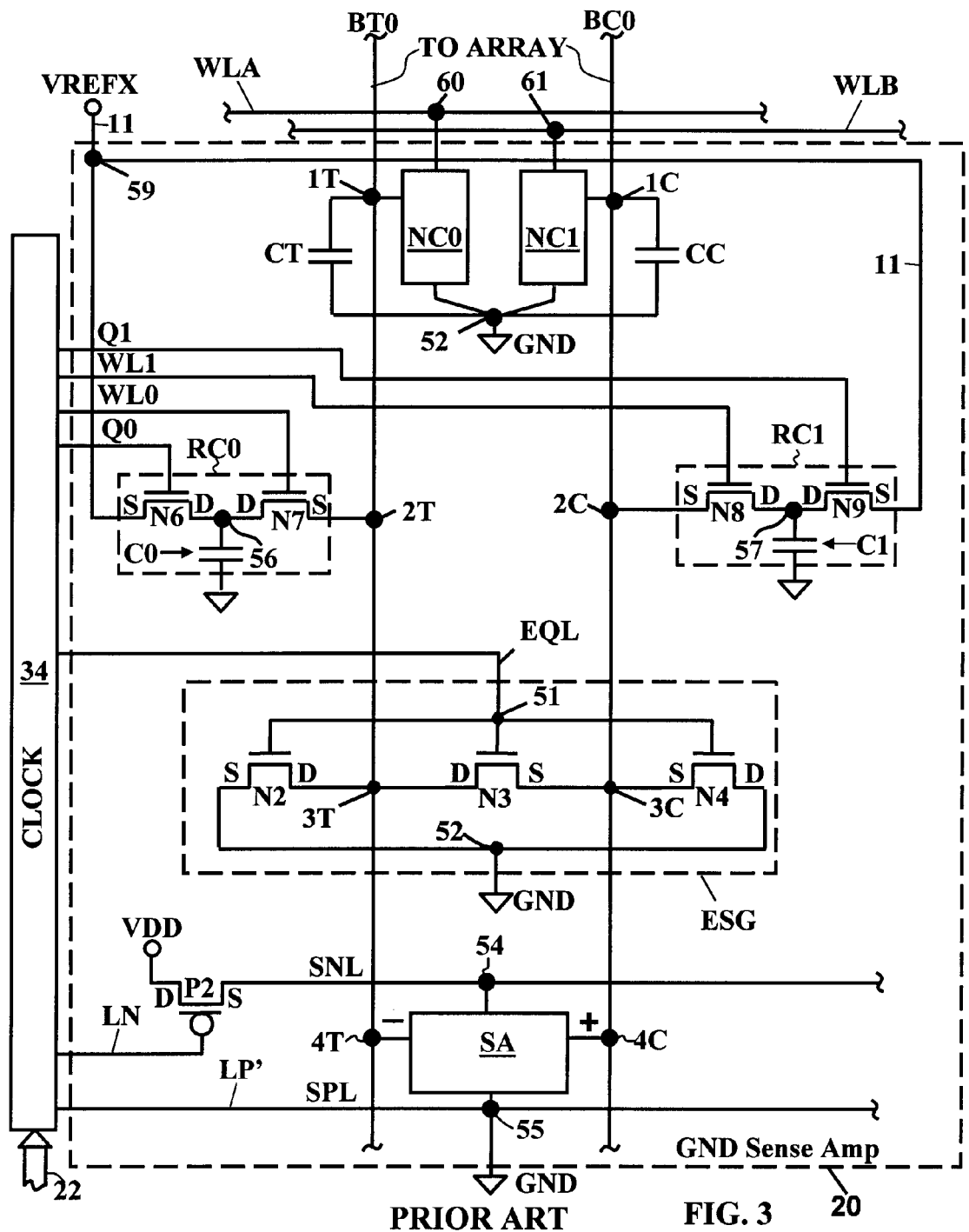
FIG. 3 shows a prior art combination of a clock and a GND sense system that operates in accordance with the signal timing diagram shown in FIG. 4.
Figure 4:
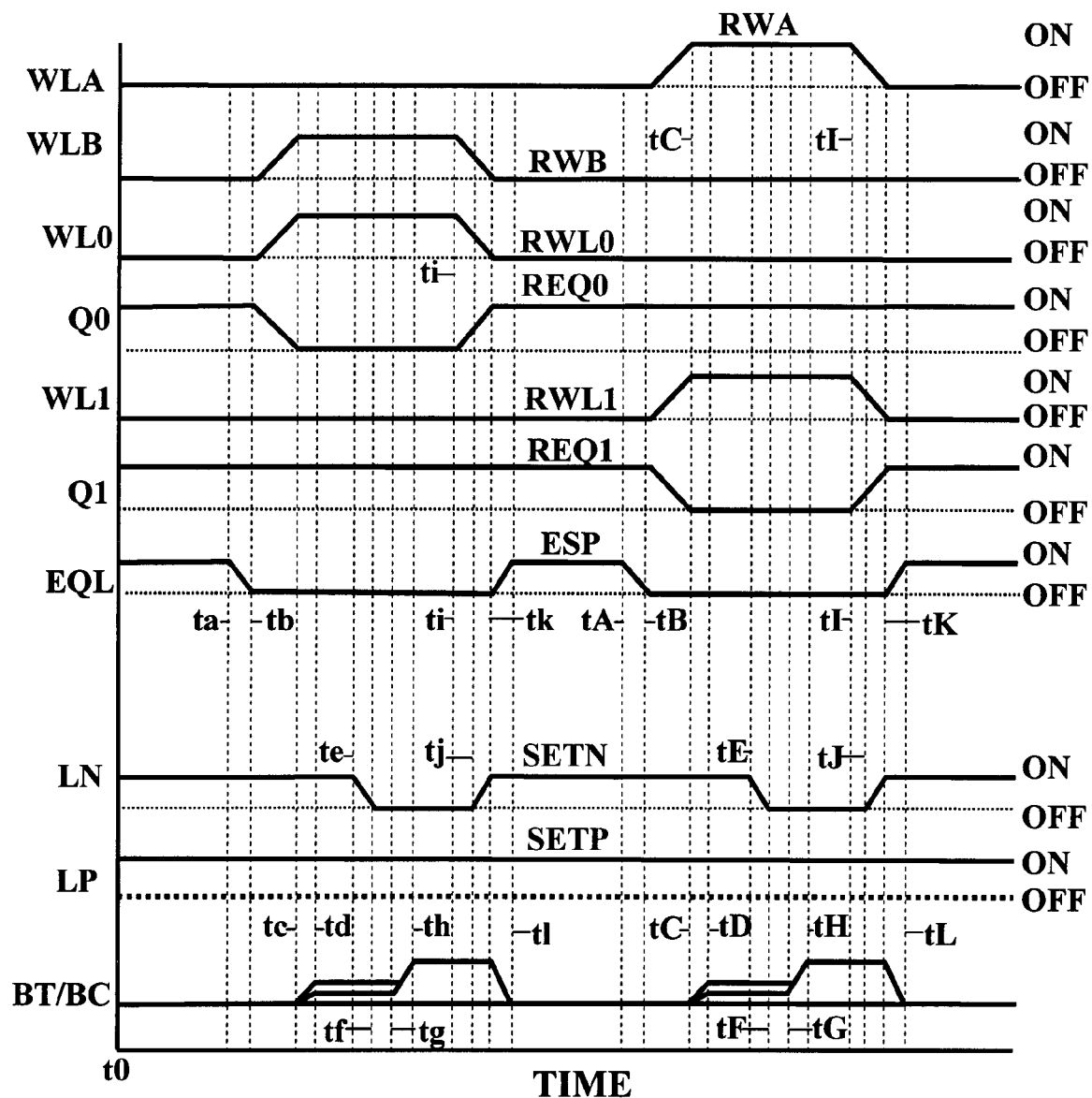
Figure 5:
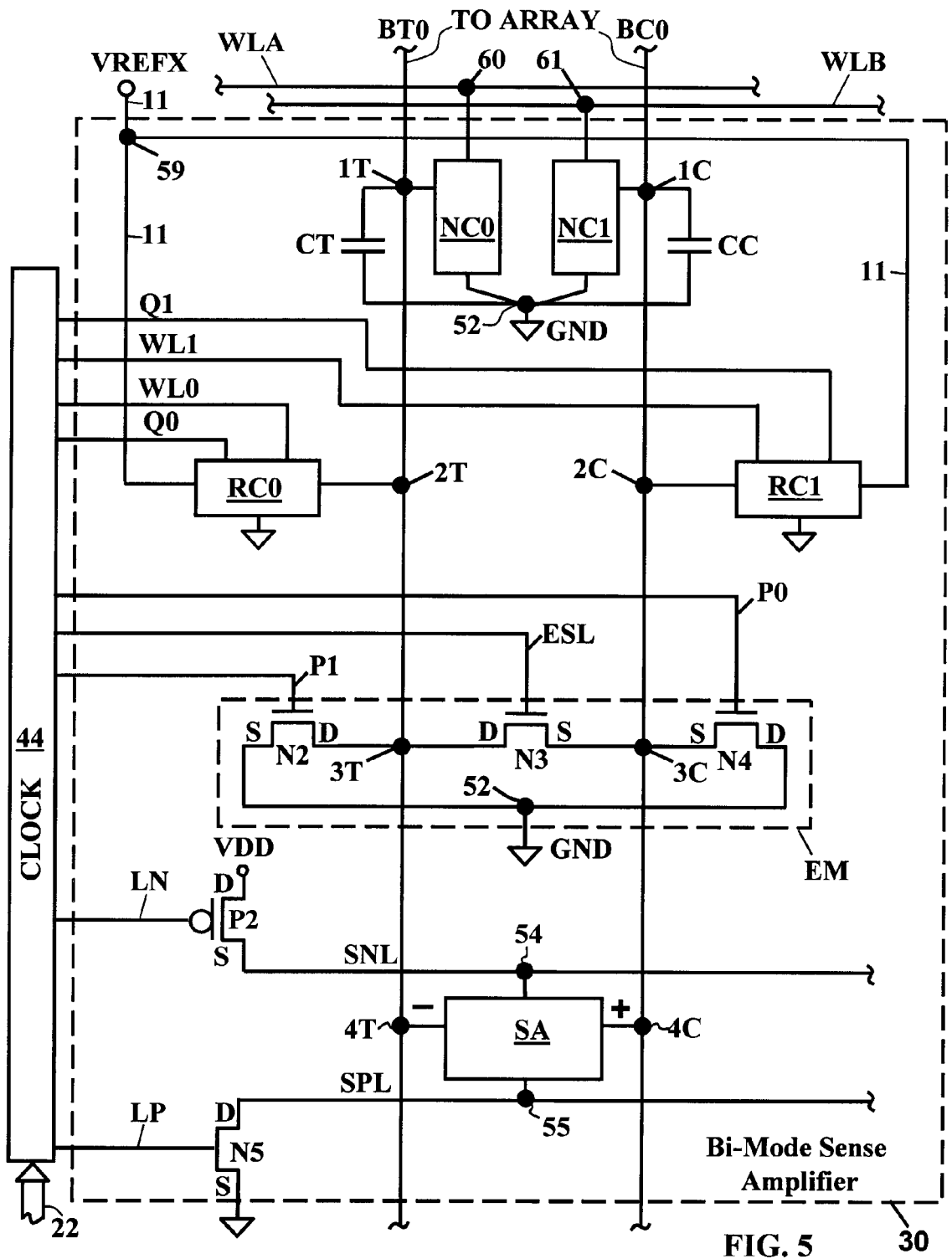
FIG. 5 shows a combination of a clock and a bi-mode sense amplifier system designed in accordance with this invention comprising a modification of the Mid-Level sense amplifier of FIG. 1 and the GND precharge system of FIG. 3. The reference cell is used for the bitline precharge function.

FIG. 5 shows a combination of clock 44 and the bi-mode sense amplifier system 30 designed in accordance with this invention comprising a combination of features of the Mid-Level sense amplifier of FIG. 1 and the GND precharge system of FIG. 3 during the first phase of operation in which a true bitline normal cell NC0 and a complimentary bitline reference cell RC1 are activated to connect the storage capacitor CS0 to the true bitline BT0 in response to a true wordline pulse RWA on true wordline WLA. The true normal cell NC0 and the complementary normal cell NC1 are the same as in FIG. 1. The reference cell RC0 and the reference cell RC1 are the same as in FIG. 3. The reference cell RC0 and the reference cell RC0 and the reference cell RC1 are the same as in FIG. 3. The reference cell in this embodiment is used as the bitline precharge purpose.

Figure 6A:
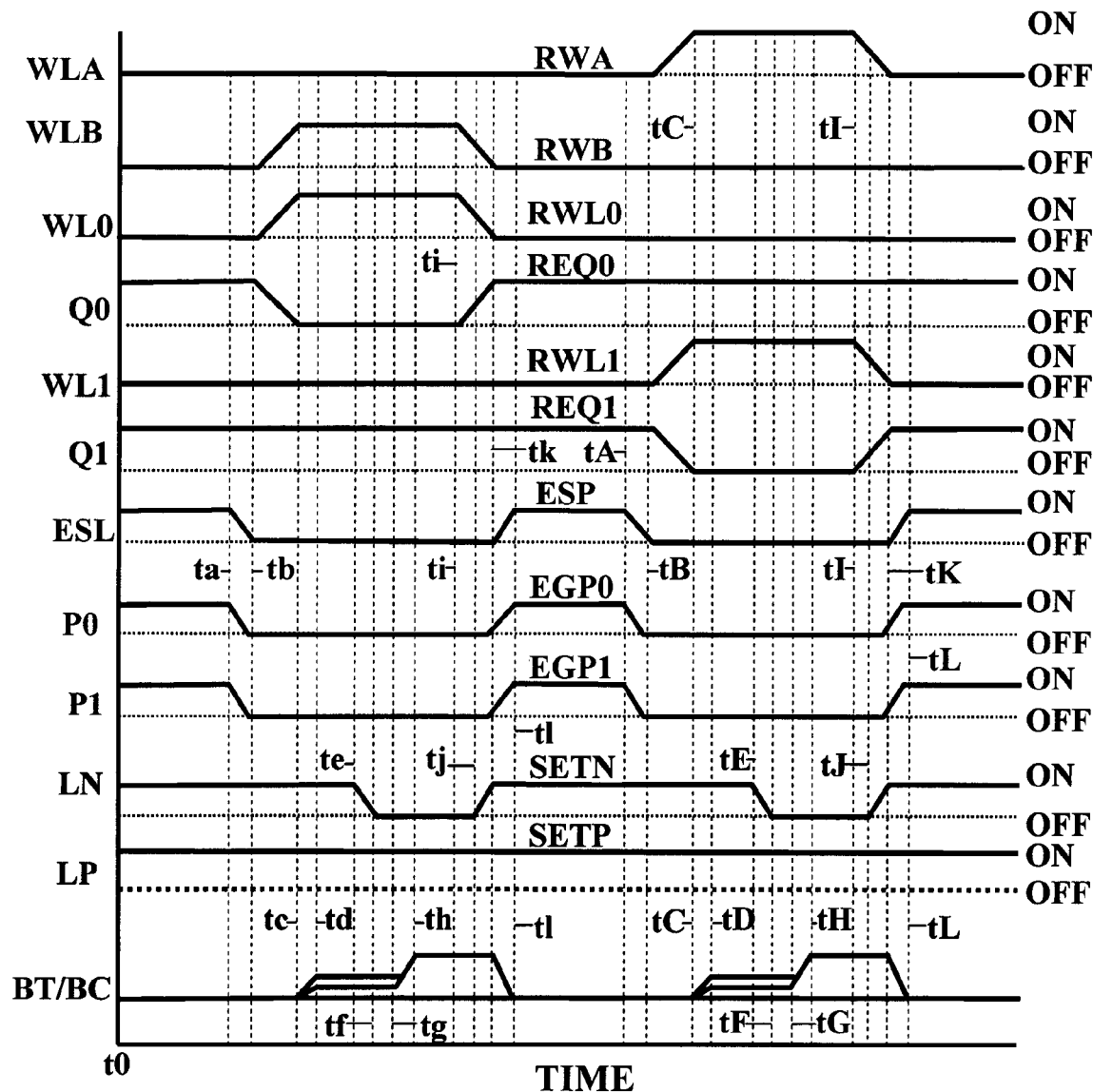
FIG. 6A shows the signal timing diagrams of the GND precharge for the mission modes of operation of the circuit of FIG. 5.
Figure 6B:
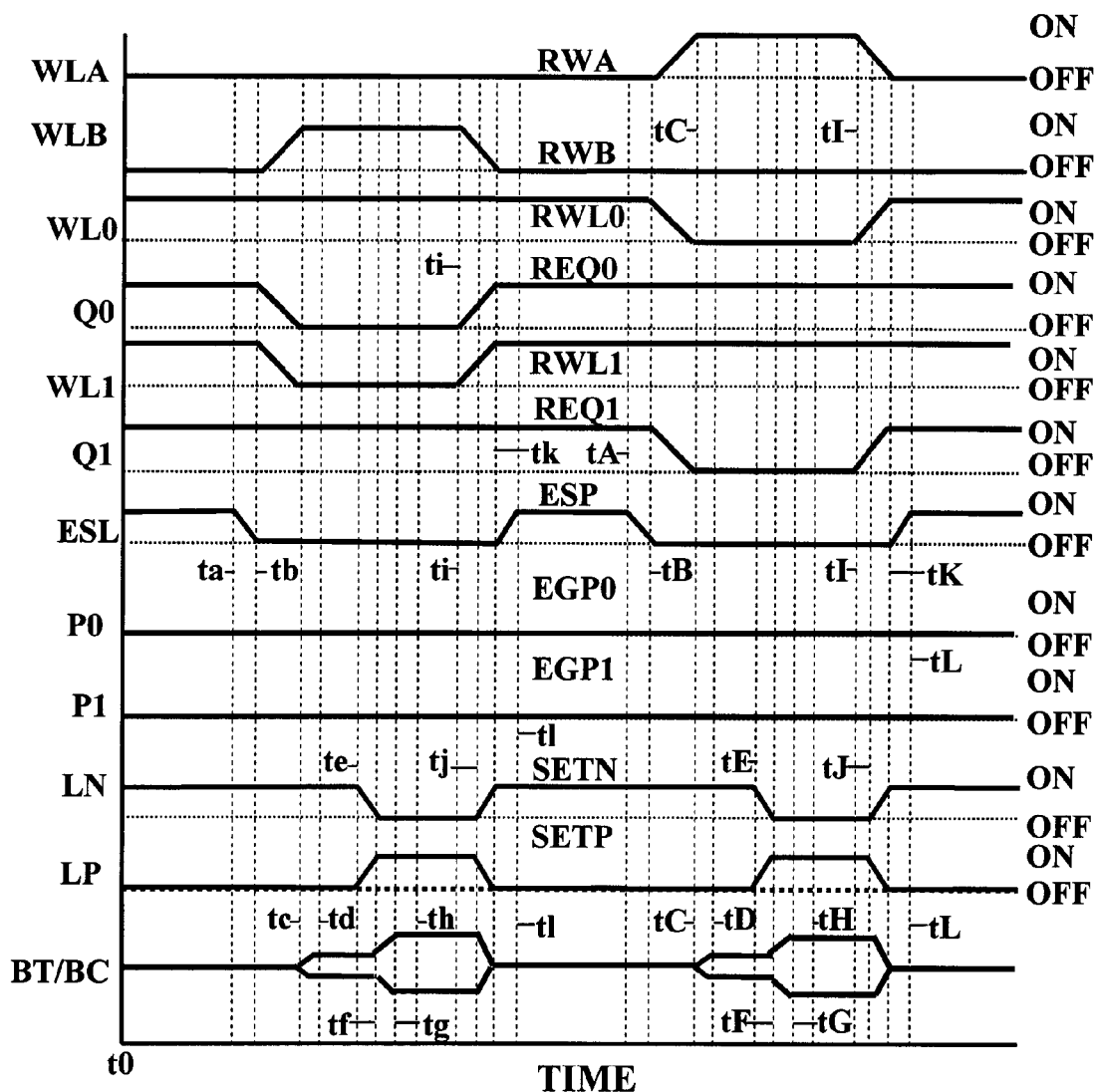
FIG. 6B shows the signal timing diagram of the mid-level (VDD/X) precharge for the data retention, self-refresh, mode of operation of the circuit of FIG. 5.

FIG. 6A shows the signal timing diagrams of the GND precharge for the mission modes of operation of the circuit of FIG. 5. In addition, FIG. 6B shows the signal timing diagram of the mid-level (VDD/X) precharge for the data retention, self-refresh, mode of operation of the circuit of FIG. 5.

The system 30 of FIG. 5 operates in accordance with an alternative phase of operation in which the complementary bitline normal cell NC1 and a true bitline reference cell RC0 are activated to connect the storage capacitor C1 to the complementary bitline BC0 in response to a complementary wordline pulse RWB' on the complementary wordline WLB from t0 to t1, the complementary bitline normal cell NC0 and a true bitline reference cell RC1 are activated to connect the storage capacitor C0 to true bitline BT0 in response to a complementary wordline pulse RWA' on the complementary wordline WLA.

As stated above, FIG. 5 shows a combination of the clock 44 and the bi-mode sense amplifier system 30 designed in accordance with this invention comprising a modification of Mid-Level sense amplifier 10 of FIG. 1 and the GND precharge system 20 of FIG. 3.

Figure 2:
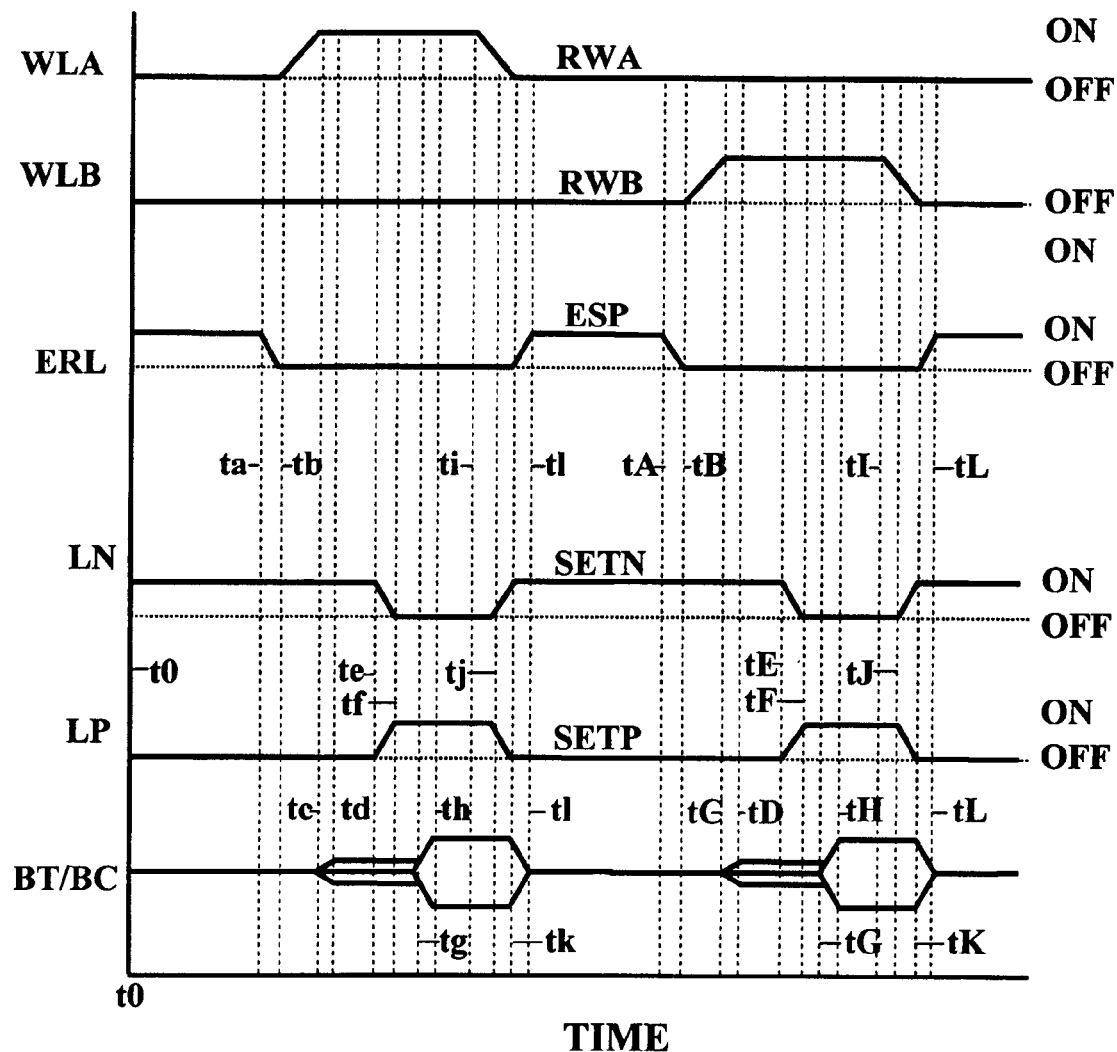

The bi-mode sense amplifier system 30 includes a sense amplifier SA plus eleven other FETs, so that there are four more FETs than in FIG. 1 and there is one more FET than in the system of FIG. 3. Moreover, the clock 44 has been modified to provide the alternative pulse sequences seen in FIG. 5. The sense amplifier SA shown in FIG. 5 is preferably identical to the sense amplifier SA shown in FIG. 1, but it can be modified to include another equivalent sense amplifier circuit as will be well understood by those skilled in the art. In the bi-mode sense amplifier system 30, as contrasted with system 10 in FIG. 1 and system 20 of FIG. 2, the connection line 11 has been disconnected from the NFETs N2 and N4 in a modified equalization short-circuiting and grounding circuit EM. The line ERL from the clock 24 of FIG. 1 has been replaced in FIG. 5 by the separate connection lines P0, ESL, and P1 from clock 44 for signals EGP0, ESP, and EGP1 respectively. In other words the clock 44 has been modified to produce separate outputs to the separate connection lines P1, ESL, and P0. The modifications permit the FIG. 5 system 30 to be versatile in that it is capable of operating in both the mid-level for self-refresh or data retention mode and the GND precharge for mission mode as a function of particular clock signals generated by the clock 44.

In the bi-mode sense amplifier system 30 of FIG. 5 (as in FIG. 1), during the data retention mode, when the LP signal causes the NFET N5 to conduct, it connects node 55 to GND via line SPL. Thus node 55 and line SPL are separated from GND by the source/drain circuit of the NFET N5 to prevent current burn in the Mid-Level (VDD/2) data retention mode, or self-refresh mode of operation of the bi-mode system 30, that is controlled by timing pulses from clock 44 in the timing diagram of FIG. 6B.

The equalization short circuiting control signal line ESL for equalization pulses ESP from the clock 44 is connected to NFET N3 of the modified equalization short-circuiting and grounding circuit EM. The equalization control signal lines P1 and P0 for equalization-and-grounding pulses EGP0 and EGP1 from clock 44 are connected respectively to NFETs N2 and N4 of the modified equalization short-circuiting and grounding circuit EM. The equalization-and-grounding pulses EGP0/ESP/EGP1 are separated and EGP0/EGP1 are kept low to disable GND precharge in the mid-level data retention mode whereas the equalization signal ESP from the clock 44 is actively controlled to shorten BT and BC as shown in the signal timing diagram of FIG. 6B.

In the bi-mode grounding and/or short-circuiting equalization system 30 of FIG. 5, the equalization-and-grounding pulses EGP0 and EGP1 are supplied on lines P0 and P1 to gates of NFET N2 and NFET N4 respectively and short-circuiting signal ESP is supplied on line ESL to the gate of NFET N3. When operating in the mid-level VDD/X self-refresh, data retention mode, the grounding equalization signals EQP0 and EQP1 remain OFF as shown by the timing diagrams in FIG. 6B, whereas the short-circuiting signal ESP is ON from time t0(tl) to time ta(tA) in each cycle of operation. On the other hand, when operating in the GND, mission mode of FIG. 6A, all of the equalization signals EQP0, EQP1 and EQP are ON from time t0(tl) to time ta(tA). This change in the equalization timing signals is a factor in a switch between the mid-level VDD/X self-refresh, data retention mode and the mission mode operation of bi-mode sense amplifier 30 of FIG. 5.

Gating a mid-level potential VREFX onto the source/drain circuits of equalization short-circuiting circuit ESR in FIG. 1 or a ground potential GND onto the source/drain circuits grounding-short-circuiting equalization circuit ESG in FIG. 3, unacceptably degrades GND precharge performance. Instead, in FIG. 5 bi-modal sense amplifier system, a mid-level potential VREFX is applied to the bitlines by altering the Reference Wordline Decode system and utilizing either the reference cells RC0/RC1 as the bitline precharge device for bitline BT0 or bitline BC0 respectfully.

Referring to the circuit 30 of FIG. 5 and the timing diagram in FIG. 6B of the mid-level VDD/X self refresh, or data retention mode of operation, during a precharge cycle from t0 to tb; from ti to tB and from tl to tb, both reference word-lines WL0 and WL1 which supply signals RWL0 and RWL1 and both reference equalize controls signals REQ0 and REQ1 on lines Q0 and Q1 are active, providing the mid-level potential VREFX to the bitlines via reference cells RC0 and RC1. During each active cycle (which follows the precharge cycle e.g. from time tb to tk and tB to tL) of mid-level VDD/X data retention mode, the reference word-line signals RWL0, RWL1 and reference wordline equalization signals REQ0, REQ1 on lines Q0 and Q1 in FIG. 5 are selectively controlled as shown in FIG. 6B to provide VDD/X to bitlines BT and BC. When accessing NC0 from time tB to tL by activation signal RWA on line WLA, the signals RWL0 and REQ1 on lines WL0 and Q1 are disabled while the clock 44 keeps signals RWL1 and REQ0 on lines WL1 and Q0 "High". Thus, keeping signal RWL1 "High" can balance the bitline capacitors between lines BT0 and BC0.

Reference cells RC0 and RC1 are used in conjunction with clock signals from the clock 44 to provide the bitline precharge function. The signal REQ0 on line Q0 is ON except from time tb to time ti. The signal RWL0 on line WL0 is ON from time tB to time tl. The signal REQ1 on line Q1 is ON except from time tB to time tl. The signal RWL1 on line WL1 is ON from time tb to time ti. When the bi-mode sense amplifier 30 of FIG. 5 is operating in the mission mode, the unselected signal RWL1 on FIG. 5 reference word-line WL1 is OFF continuously until time tB in FIG. 6A. The signal RWL0 on selected wordline WL0 is OFF from time t0 to time tb and transitions to ON from time tb to time tc remaining ON from time tc to time ti and transitioning to OFF at time ti, remaining OFF until time tb in the next cycle. On the other hand, the reference wordline equalize control signal REQ0 on line EQ0 is ON from time tl to time tb transitioning to the inactive OFF state starting from time tb to time tc. It remains OFF from time tc to time ti when it transitions to ON at time ti. It remains ON until time tb in the next cycle. This transition provides the dynamic bitline balancing desired to offset the active word-line coupling. Thus signals REQ0 and RWL0 have complementary waveforms with one being ON while the other is OFF. In the mission modes of FIG. 5, the signal RWL1 is OFF continuously and the signal REQ1 is ON continuously.

SECOND EMBODIMENT

Figure 7:
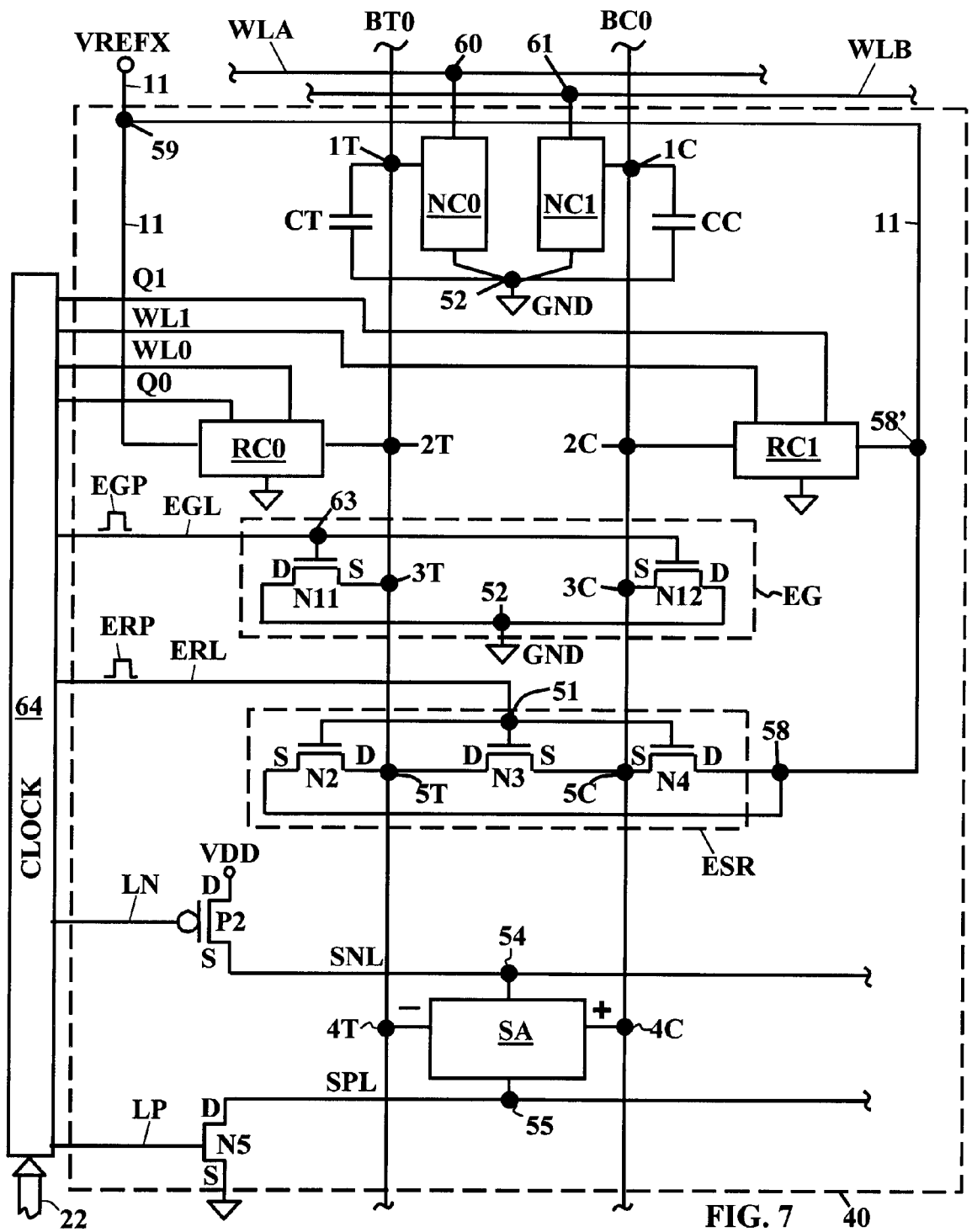
FIG. 7 is a schematic diagram of a second embodiment of the present invention in which a combination of a clock and a bi-mode sense amplifier system includes a MOSFET dual precharge circuit, which shows a modification of the system as shown in FIG. 5.

FIG. 7 is the schematic diagram of a second embodiment of the present invention in which a combination of a clock 64 and a bi-mode sense amplifier system 40 includes dual precharge circuits, which is a modification of the bi-mode sense amplifier system as shown in FIG. 5. The true normal cell NC0 and the complementary normal cell NC1 are the same as in FIG. 1. Reference cell RC0 and reference cell RC1 are the same as in FIG. 3.

FIG. 7 is a schematic diagram of the combination of a clock 64 a dual precharge circuit 40 which includes a sense amplifier SA, plus thirteen other MOSFETs or two more FETs than for FIG. 5. The sense amplifier SA can be identical to the sense amplifier SA shown in FIG. 1 or can be modified to include another equivalent sense amplifier circuit.

Figure 8:
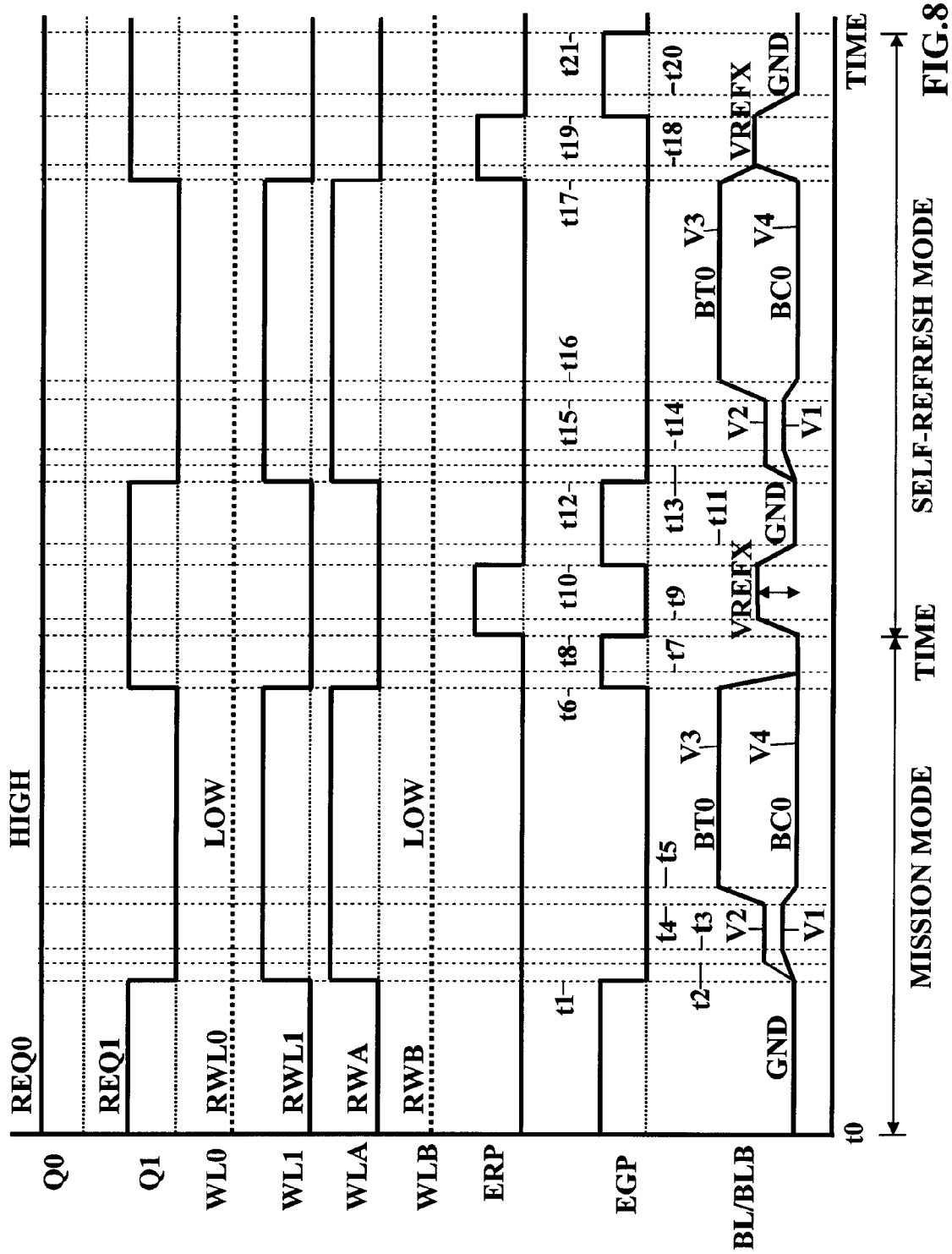
FIG. 8 shows the signal timing diagram of wordline, equalization signal, equalization pulse, true bitline, and complementary bitline potentials applied to and generated in the circuit of FIG. 7.

FIG. 8 shows the signal timing diagram of wordline, equalization signal, equalization pulse, true bitline and complementary bitline potentials applied to and generated in the circuit of FIG. 7.

In FIG. 7, as in FIG. 5, the MOSFET system 40 includes wordlines WLA/WLB, reference wordlines RWL0/RWL1, reference wordline equalization-and-grounding lines REQ0/REQ1, a bitline BT0, a complementary bitline BC0, a sense amplifier SA with SNL and SPL input lines thereto, a SETN input on line LN for actuating PFET P2 to connect voltage VDD to the SNL input line to sense amplifier SA via node 54, a SETP input for actuating NFET N5 to connect sense amplifier SA via node 55 and the SPL input line to ground potential. Also there is a reference voltage source VREFX which has a value between the voltage of the power supply voltage VDD and ground (reference potential). In addition there is a true normal cell NC0 which includes an NFET N15 and a storage capacitor CS0. A complementary normal cell NC1 includes an NFET N14 and a storage capacitor CS0. A true bitline reference cell includes NFETs N6/N7 and capacitor C1. A complementary normal cell NC1 includes NFETs N8/N9 and capacitor C2.

The embodiment of the invention shown in FIG. 7 is different from the embodiment of FIG. 5 in that system 40 includes a VREFX equalization circuit ESR including equalization NFETs N2, N3 and N4 which is similar to or possibly identical to the VREFX equalization circuit ESR shown in FIG. 1. Unlike the embodiment of FIG. 5, FIG. 7 employs VREFX-short-circuiting equalization circuit ESR of FIG. 1 which comprises three equalization NFETs N2, N3 and N4 which have their gates connected via node 51 to be turned ON when they receive the reference potential equalization pulse ERP on the reference potential equalization line ERL as described above with respect to FIG. 1.

The embodiment of the invention shown in FIG. 7 is also different from what is shown in previous drawings herein as it includes an additional equalization circuit comprising an equalization-and-grounding circuit EG which includes to two discharge NFETs N11 and N12.

The source of the NFET N11 is connected to node 3T. The source of the NFET N12 is connected to node 3C. The drains of the two discharge NFETs N11/N12 are connected to GND via node 52. The gates of two discharge NFETs N11/N12 of the equalization-and-grounding circuit EG are connected via node 63 to be turned ON when they receive equalization-and-grounding pulses EGP from the clock 64 on the equalization-and-grounding line EGL discharging the capacitors CT and CC. When the equalization-and-grounding pulses EGP on line EGL are connected to the gates of the two discharge NFETs N11/N12 their source drain circuits conduct thereby connecting the nodes 3T and 3C to GND and short circuiting them together which discharges complementary bitline BC0 and true bitline BT0, thereby equalizing the potential thereon at GND potential.

Mission Mode of Operation

Referring to FIG. 8 in the mission mode of operation there are two positive equalization-and-grounding pulses EGP generated on equalization-and-grounding line EGL. The EGP pulses are generated for the purpose of discharging true bitline BT0 and complementary bitline BT0 to ground GND. The EGP pulses are generated in the mission mode from time t0–t1 and from time t6–t8. During those time periods, those pulses cause equalization grounding circuit EG to operate in response to an equalization-and-grounding pulses EGP connected thereto on the equalization-and-grounding line EGL via node 63 to energize the gates of the two discharge NFETs N11/N12. The result is that when the equalization-and-grounding pulse EGP on equalization-and-grounding line EGL is high, NFETs N11/N12 turn ON thereby discharging both true bitline capacitor CT and complementary bitline capacitor CC by connect-ing nodes 3T and 3C via source drain circuits of discharging NFETs N11/N12 to GND so that both plates of true bitline capacitor CT and complementary bitline capacitor CC are at or near GND potential in response to each equalization-and-grounding pulse EGP on equalization-and-grounding line EGL.

When at time t1, the first equalization-and-grounding pulse EGP on equalization-and-grounding line EGL goes to its OFF state and both wordline WL and RWL1 are ON, then cell access starts. The true bitline BT0 and complementary bitline BC0 change their voltages from times t1 to t3 following stored voltages on storage capacitor CS and complementary bitline reference cell capacitor CC respectively. The voltage levels V2 on both true bitline BT0 and V1 on complementary bitline BC0 are maintained until time t4 when true bitline BT0 rises towards a maximum value V3 and complementary bitline BC0 drops towards voltage V4.

The voltages V3/V4 are reached on the true bitline BT0 and the complementary bitline BC0 respectively at time t5 and are maintained until time t6 when a second equalization-and-grounding pulse EGP is applied to equalization-and-grounding line EGL causing the voltage on the true bitline BT0 and the complementary bitline BC0 to reach GND once again at time t7 remaining at that level until the end of the mission mode cycle.

At time t1 the wordline WLA and reference wordline RWL1 are turned ON and remain on until time t6 when both wordline WLA and line RWL1 are turned OFF simultaneously with the rise of equalization-and-grounding pulse EGP on line EGL. During the self-refresh precharge time from t1 to t4, reference wordline equalizing signal REQ1 is turned OFF but line RWL1 raises the gate of NFET N9 which conducts so that the reference cell node of complementary bitline reference cell capacitor C2 which was refreshed previously charges line BC0 to the reference potential V1 (VREFX).

When at time t12, each of the equalization-and-grounding pulses EGP on the equalization-and-grounding line EGL returns to an OFF state and both signal RWA wordline on line WLA and signal RWL1 are ON, then cell access starts. The true bitline BT0 and the complementary bitline BC0 change their voltages from times from times t13 to t14 following the stored voltages on storage capacitor CS and complementary bitline reference cell capacitor CC respectively. The voltage levels V2/V1 on both BT0 and BC0 are maintained until times t4/t15 when the true bitline BT0 begins to rise to a maximum value V3 and complementary bitline BC0 begins to drop to voltage V4.

During operation in the mission mode the reference potential equalization pulse ERP remains off continuously from t0 to t8 so that the true bitline BT0 and the complementary bitline are never charged to VREFX, when the system of FIG. 7 is operating in the mission mode.

Data Retention or Self-Refresh Mode of Operation

Referring again to FIG. 8 operation in the self-refresh mode starts at time t8. At times t8, t12, and t21 in the self-refresh mode of operation, the equalization-and-grounding pulse EGP on line EQL is OFF or turns OFF so that the VREFX power source is disconnected from both true bitline line BT0 and complementary bitline line BC0, since there is no conduction through NFETs N2, N3 and N4 of the VREFX equalization circuit ESR nor is there equalization of voltage on the true bitline BT0 and the complementary bitline BC0.

From time t8 to t10 and from time t17 to t19, when the reference potential equalization pulse ERP on the reference potential equalization line ERL is high to enable the precharge process during two periods, when the signal RWA on the wordline signal on line RWL1 is turned OFF, the potential on the gates of all three of the NFETs N2, N3 and N4 (of the VREFX equalization circuit ER) rises causing them to conduct. The NFET N3 turns on creating a short circuit between the true bitline BT0 to the complementary bitline BC0 equalizing the voltage thereon by transferring the charge between the true bitline capacitor CT and a complementary bitline capacitor CC. At the same time the NFETs N2 and N4 connect the true bitline BT0 and the complementary bitline BC0 via node 58 and line 11 to the voltage of VREFX for the purpose of charging the true bitline BT0 and complementary bitline BC0 to the voltage of VREFX. The equalizing charge flows through line 11, nodes 59, 58' and 58, the source/drain circuits of NFETs N2 and N4, then through nodes 5T and 5C and the complementary bitline BC0, true bitline BT0 to change the charge on capacitors CT and CC during the equalization phase of operation. Thus the reference potential equalization pulse ERP on the reference potential equalization line ERL adjusts the precharges on true bitline capacitor CT and complementary bitline capacitor CC by raising the potential on both true bitline BT0 and complementary bitline BC0 to a voltage VREFX where it is maintained from time t9 to t10 and from time t18 to t19 in response to pulses EGP that begin at times t8, and t17 in FIG. 8. The precharge power supply for voltage VREFX can be the same power as that which is applied to the same voltage regulator as that supplies a voltage level to the reference cells.

In the self-refresh mode, at times t10 and t19, the reference potential equalization pulse ERP on reference potential equalization line ERL turns OFF disconnecting VREFX power from both true bitline line BT0 and complementary bitline line BC0, by terminating conduction through NFETs N2/N3/N4 of the VREFX equalization circuit ESR and thereby again terminating the equalization of voltage on true bitline BT0 and complementary bitline BC0.

Simultaneously, with the end of the reference potential equalization pulse ERP at times t10 and t19, the gates of the two discharging NFETs N11/N12 of equalization-and-grounding circuit EG receive equalization-and-grounding pulses EGP via node 63 from the equalization-and-grounding line EGL. Referring to FIG. 8, the pulses EGP on equalization-and-grounding line EGL continue in the self-refresh mode first from time t10 to t12 and later from time t19 to t21. Equalization-and-grounding pulses EGP are generated for the purpose of discharging the true bitline BT0 and the complementary bitline BC0 and capacitors CT and CC to ground. The result is that when an equalization-and-grounding pulse EGP on line EGL is high, the discharging NFETs N11/N12 discharge both the true bitline capacitor CT and the complementary bitline capacitor CC by connecting the nodes 3T and 3C via source drain circuits of the discharging NFETs N11/N12 to ground GND. Thus both plates of the true bitline capacitor CT and both plates of the complementary bitline capacitor CC are at or near ground potential in response to each discharge pulse signal EGP on equalization-and-grounding line EGL.

Simultaneously, at times t10 and t19 with the turning off of reference potential equalization pulse ERP, clock 64 generates an equalization-and-grounding pulse EGP on equalization-and-grounding line EGL that raises the potential on the gates of grounding/discharge NFETs N11/N12 thereby discharging both of true bitline line BT0 and complementary bitline line BC0 to GND, which a short time ago had been precharged to VREFX from times t9 to t10 and from times t18 to t19. Shortly after times t10 and t19 at times t11 and t20, true bitline BT0 and complementary bitline BC0 have discharged to GND.

At time t12, wordline WLA and reference wordline RWL1 turn ON and remain ON until time t17 when both wordline WLA and line RWL1 turn OFF simultaneously with the rise of the equalization-and-grounding pulse EGP on line EGL. During the self-refresh precharge time from t8 to t12, reference wordline equalizing signal REQ1 is turned ON which raises the gate of NFET N9 which conducts so that the reference cell node of complementary bitline reference cell capacitor C2 is refreshed by charging it to the reference potential VREFX.

From times t12 to t17 in the self-refresh mode the signal RWA on wordline WLA is up, raising the gate of NFET N15 in the normal cell NC0 to turn it on so the true bitline BT0 which has been amplified to the "1" data voltage V2 (VDD/X) from ground voltage GND, at time t13, charges the storage capacitor CS0 to voltage V2 (VDD/X). This amplification is done by the bitline sense amplifier SA. At the same time the complementary bitline BC0 is charged to voltage V1.

When at time t12, each of the equalization-and-grounding pulse EGP on the equalization-and-grounding line EGL returns to an OFF state and both signal RWA wordline on line WLA and signal RWL1 are ON, then cell access starts. True bitline BT0 and complementary bitline BC0 change their voltages from times from times t13 to t14 following the stored voltages on storage capacitor CS and complementary bitline reference cell capacitor CC respectively. The voltage levels V2/V1 on both BT0 and BC0 are maintained times t4/t15 when the true bitline BT0 begins to rise to a maximum value V3 and complementary bitline BC0 begins to drop to voltage V4.

The voltages V3/V4 are reached at time t16 and are maintained until time t17 when the second reference potential equalization signal ERP is applied to reference potential equalization line ERL causing the voltages on true bitline BT0 and complementary bitline BC0 to converge on VREFX once again by the operation of the VREFX equalization circuit ESR as described above. In a similar manner and voltages V3/V4 are reached at time t16 and are maintained until time t17 in the self-refresh mode.

During self-refresh mode the cycle of from t10 to t17 and from time t19 to t21 the reference potential equalization pulse ERP remains off. The bitline precharge level drops from VREFX to GND dynamically from time t10 to time t12 and from time t19 to time t21.

THIRD EMBODIMENT

Figure 9:
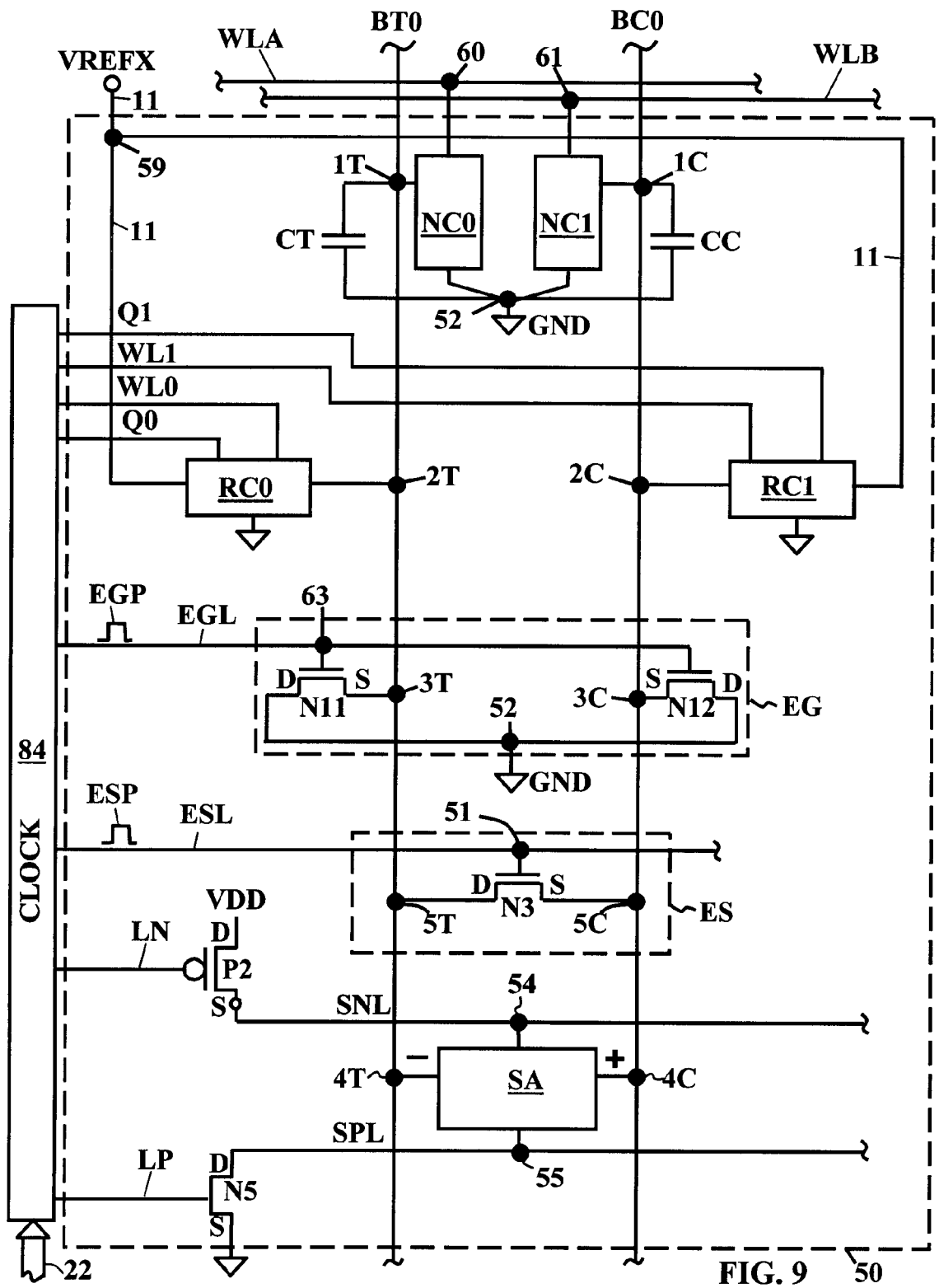
FIG. 9 is a schematic diagram of a third embodiment of the present invention in which a combination of a clock and a bi-mode sense amplifier system includes a MOSFET dual precharge circuit, which show a modification of the system as shown in FIG. 7.

FIG. 9 is a schematic diagram of a third embodiment of the present invention in which a bi-mode sense amplifier system includes a MOSFET dual precharge circuit, which show a modification of the system as shown in FIG. 7. The true normal cell NC0 and the complementary normal cell NC1 are the same as in FIG. 1. The reference cell RC0, and the reference cell RC1 are all the same as in FIG. 3

FIG. 9 shows a modification of the circuit of FIG. 7 including a clock 84 and a system 50. System 50 includes fourteen transistors and four capacitors. The circuit inside the sense amplifier block SA can be identical to the sense amplifier SA shown in FIG. 1 or can be modified to include another equivalent sense amplifier circuit. Instead of the three equalization NFETs N2, N3 and N4 of the VREFX reference potential equalization circuit ESR in FIG. 7 that are tied to operate in response to the equalization signal on line EQS, in FIG. 8 there is a shorting equalization circuit ES which includes only one NFET N3. The shorting-equalization circuit ES is connected to operate in response to shorting-equalization pulse ESP on shorting-equalization line ESL to equalize the voltages on true bitline BT0 and complementary bitline BC0.

During the active cycle time of self refresh mode from time t16–t17, true bitline BC0 and complementary bitline BC0 are amplified to V3=VDD/2 and V4=GND or V4=GND and V3=VDD/2 by sense amplifier SA.

Figure 10:
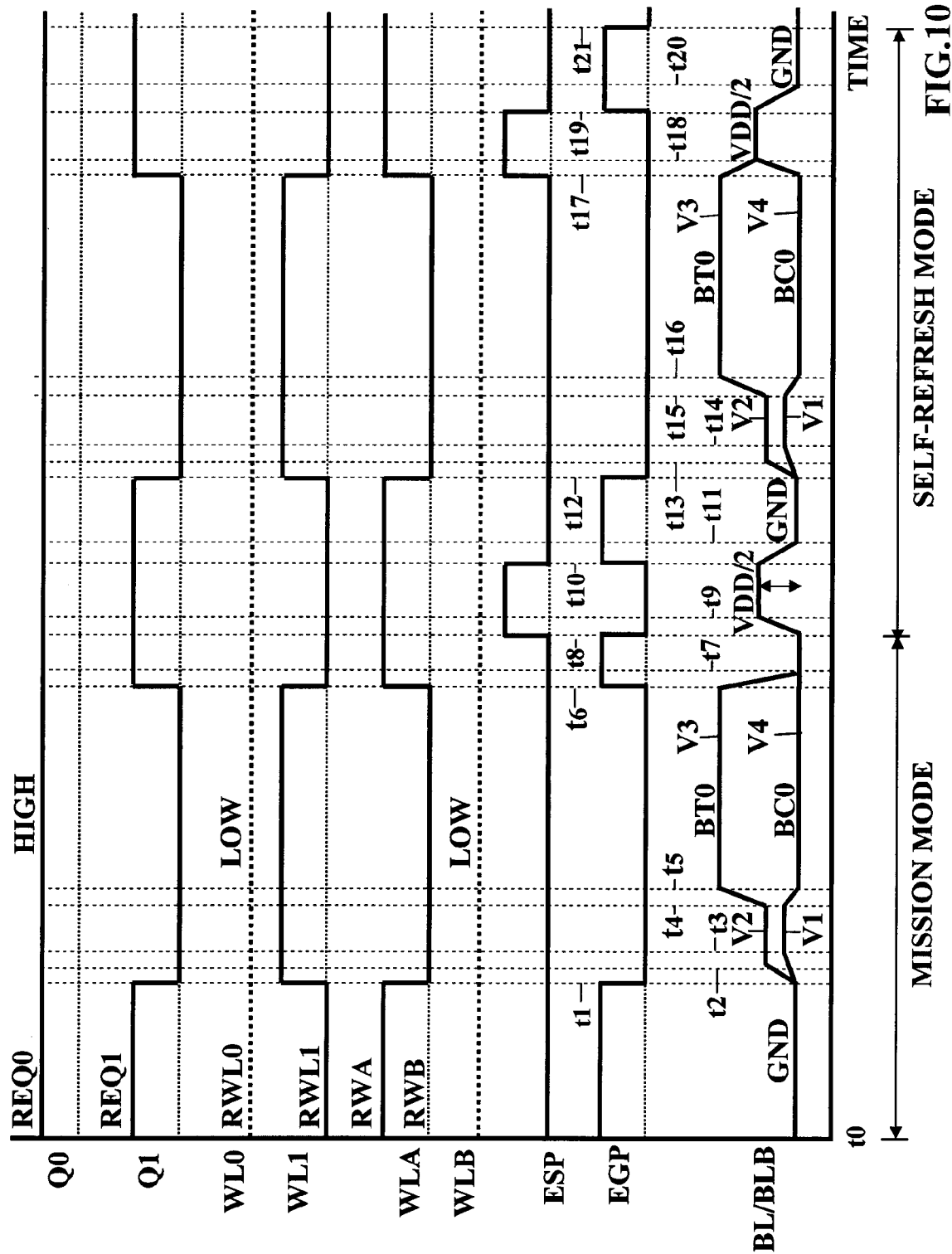
FIG. 10 shows the timing diagram and signal level of signals for the system of FIG. 9.

During the precharge time of self refresh mode from time t8 to t10 and t17 to t19 in FIG. 10, the true bitline BT0 and complementary bitline BC0 are kept at voltage VDD/2 (instead of VREFX) without any power supply by shunting, i.e. short circuiting true bitline BT0 and complementary bitline BC0 together. The reason that the voltage is VDD/2 is that the one true bitline capacitor CT will have been at GND and the other bitline capacitor CC will have been at the potential VDD or vice versa, so the average of those two voltages is ½ VDD, i.e. VDD/2.

FIG. 10 shows the timing diagram and signal levels for the system of FIG. 9. The roles and timing of all of the signals are same as in FIG. 8 except for the precharge level during the refresh mode.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An electronic memory system including a memory array which includes a number of pairs of bitlines comprising:
   a true bitline and a complementary bitline;
   a first normal cell connected to the true bitline and a second normal cell connected to the complementary bitline;
   a first reference cell connected to the true bitline and a second reference cell connected to the complementary bitline, a clock for generating timing pulses including short circuiting-equalization pulses and for selectively providing reference potential pulses in a reference potential mode of operation;
   a sense amplifier having a true terminal connected to the true bitline and a complementary terminal connected to the complementary bitline;
   equalization short circuiting means connected to the clock and to the true bitline and the complementary bitline for short circuiting the true bitline and the complementary bitline together in response to the short circuiting pulses to equalize the electric potential thereon as a function of short circuiting-equalization; and
   precharge circuit means for connecting at least one of the true bitline and the complementary bitline to a electrical potential selected from a higher voltage or low voltage reference potential in response to a precharge equalization clock pulse from the clock.

2. The system of claim 1 wherein:
   there are dual precharge levels, one for normal access, mission mode and the other for data retention, self refresh mode; and
   the precharge levels are changed dynamically from mission mode to data retention, self-refresh mode.

3. The system of claim 1 wherein, two sets of transistors are used to supply two different precharge levels.

4. The system of claim 3 wherein one precharge level is supplied by VREFX, power supply voltage for precharging reference cells.

5. The system of claim 3 wherein, the other precharge level is supplied by the same power supply for precharging the true bitline and the complementary bitline during mission mode to ground.

6. The system of claim 3 wherein one precharge level is supplied by shunting true bitline and the complementary bitline during precharge cycle without any additional power supply voltage for precharging.

7. The system of claim 3 wherein one precharge level is supplied through the reference cell that is used in mission mode operation to the true bitline and the complementary bitline during a precharge cycle without any additional means to provide a precharge voltage.

8. An electronic memory system including:
   a memory array including a number of pairs of bitlines with a pair comprising
   a true bitline and a complementary bitline;
   a first normal cell connected to the true bitline and a second normal cell connected to the complementary bitline;
   a first reference cell connected to the true bitline and a second reference cell connected to the complementary bitline;
   a clock for generating timing pulses including short circuiting-equalization pulses and for selectively providing reference potential pulses in a reference potential mode of operation;
   a sense amplifier having a true terminal connected to the true bitline and a complementary terminal connected to the complementary bitline;
   equalization short circuiting means connected to the clock and to the true bitline and the complementary bitline for short circuiting the true bitline and the complementary bitline together in response to the short circuiting pulses to equalize the electric potential thereon as a function of short circuiting-equalization and connecting the bitlines to either ground or a reference voltage; and
   dual precharge circuit means for precharging in a normal access mission mode which is a data access mode operation and precharging in a data retention, self-refresh mode operation.

9. The system of claim 8 wherein:
   the dual precharge levels, one for the normal access, mission mode and the other for the data retention, self refresh mode; and
   the precharge levels are changed dynamically from mission mode to data retention, self-refresh mode.

10. The system of claim 8 wherein, two sets of transistors are used to supply two different precharge levels.

11. The system of claim 10 wherein one precharge level is supplied by VREFX, power supply voltage for precharging reference cells.

12. The system of claim 10 wherein, the other precharge level is supplied by the same power supply for precharging BT0 and BC0 during mission mode to ground.

13. The system of claim 10 wherein one precharge level is supplied by shunting the true bitline and the complementary bitline during a precharge cycle without any additional power supply voltage for precharging.

14. The system of claim 10 wherein one precharge level is supplied through the reference cell that is used in mission mode operation to the true bitline and the complementary bitline during a precharge cycle without any additional means to provide a precharge voltage.

15. A method of operating an electronic memory system including a memory array which includes a number of pairs of bitlines including a true bitline and a complementary bitline, a first normal cell connected to the true bitline and a second normal cell connected to the complementary bitline, a first reference cell connected to the true bitline and a second reference cell connected to the complementary bitline, a clock for generating timing pulses including short circuiting-equalization pulses and for selectively providing reference potential pulses in a reference potential mode of operation, a sense amplifier having a true terminal connected to the true bitline and a complementary terminal connected to the complementary bitline comprising:
   providing equalization short circuiting means connected to the clock and to the true bitline and the complementary bitline for short circuiting the true bitline and the complementary bitline together in response to the short circuiting pulses to equalize the electric potential thereon as a function of short circuiting-equalization; and providing precharge circuit means for connecting at least one of the true bitline and the complementary bitline to a electrical potential selected from a higher voltage or low voltage reference potential in response to a precharge equalization clock pulse from the clock.

16. The method of claim 15 wherein:

there are dual precharge levels, one for normal access, mission mode and the other for data retention, self refresh mode; and the precharge levels are changed dynamically from mission mode to data retention, self-refresh mode.

17. The method of claim 15 wherein, two sets of transistors are used to supply two different precharge levels.

18. The method of claim 17 wherein one precharge level is supplied by VREFX, power supply voltage for precharging reference cells.

19. The method of claim 17 wherein, the other precharge level is supplied by the same power supply for precharging the true bitline and the complementary bitline during mission mode to ground.

20. The method of claim 17 wherein one precharge level is supplied by shunting true bitline and the complementary bitline during precharge cycle without any additional power supply voltage for precharging.

* * * * *